United States Patent [19]

DiNapoli et al.

[11] Patent Number: 5,253,411
[45] Date of Patent: Oct. 19, 1993

[54] METHOD OF SECURING SEMI-CONDUCTOR WAFER USING RETENTION CLIP

[75] Inventors: Antonio DiNapoli; Gerald L. Goff; Roger A. Sikes, all of Austin, Tex.

[73] Assignee: Advanced Micro Devices, Inc., Sunnyvale, Calif.

[21] Appl. No.: 929,938

[22] Filed: Aug. 14, 1992

Related U.S. Application Data

[62] Division of Ser. No. 617,008, Nov. 21, 1990, Pat. No. 5,183,245.

[51] Int. Cl.⁵ .............................. B25B 1/00; B23Q 7/00
[52] U.S. Cl. ............................... 29/559; 29/281.1; 269/254 R; 269/155; 269/157; 269/265
[58] Field of Search .............. 29/559, 25.01, 281.1; 269/254 R, 35, 111, 126, 152, 153, 155, 157, 224, 265, 903

[56] References Cited

U.S. PATENT DOCUMENTS

| | | | |
|---|---|---|---|
| 2,342,146 | 11/1991 | Joyce | 269/254 |
| 3,218,058 | 11/1965 | Smith | 269/254 R |
| 4,776,744 | 10/1988 | Stonestreet et al. | 269/254 R |
| 4,911,597 | 3/1990 | Maydan et al. | 118/500 |
| 4,915,367 | 4/1990 | Carossino | 269/254 R |
| 4,998,712 | 3/1991 | Park et al. | 269/152 X |
| 5,033,709 | 7/1991 | Yueh | 269/254 R X |
| 5,040,484 | 8/1991 | Mears et al. | 269/254 R X |
| 5,086,371 | 2/1992 | Grammas et al. | 269/903 X |

Primary Examiner—Timothy V. Eley
Attorney, Agent, or Firm—Johnson & Gibbs

[57] ABSTRACT

A clip for removably securing a semi-conductor wafer to the treatment surface of a semi-conductor wafer processing pedestal. The clip is constructed with a pair of spaced apart, forwardly extending tines adapted to engage outer edges of a semi-conductor wafer supported upon the treatment surface. A clip tail is oppositely disposed from the tines and affords resilient movement of the tines toward and away from the edges of the pedestal treatment surface to enable the installation and removal of the wafer therefrom.

5 Claims, 4 Drawing Sheets

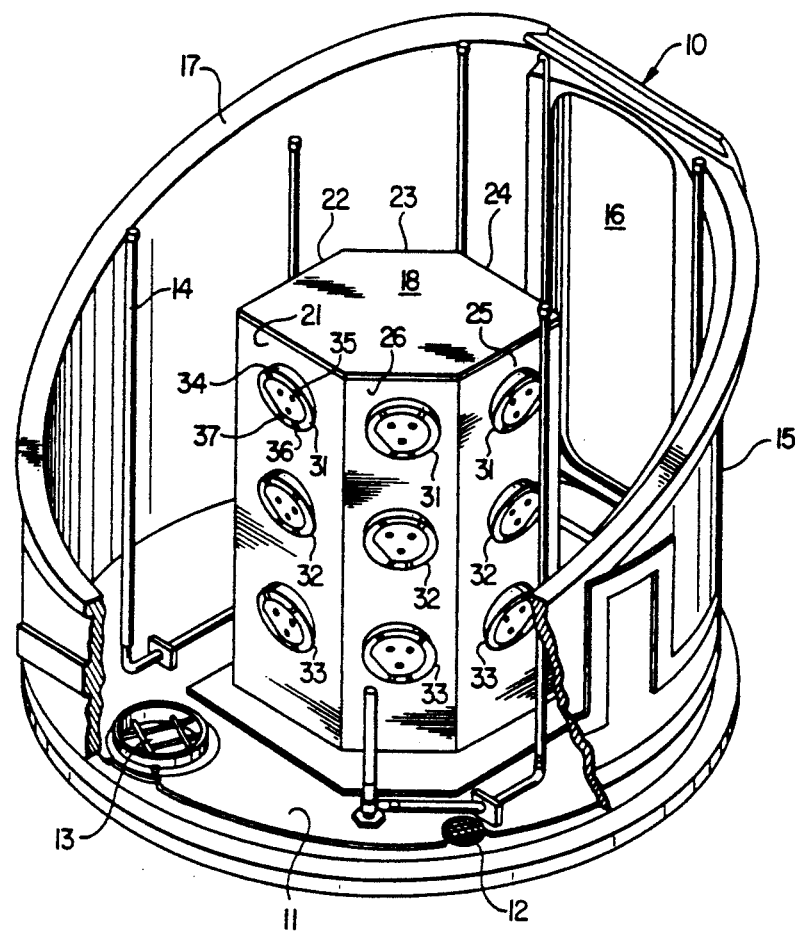
FIG. 1
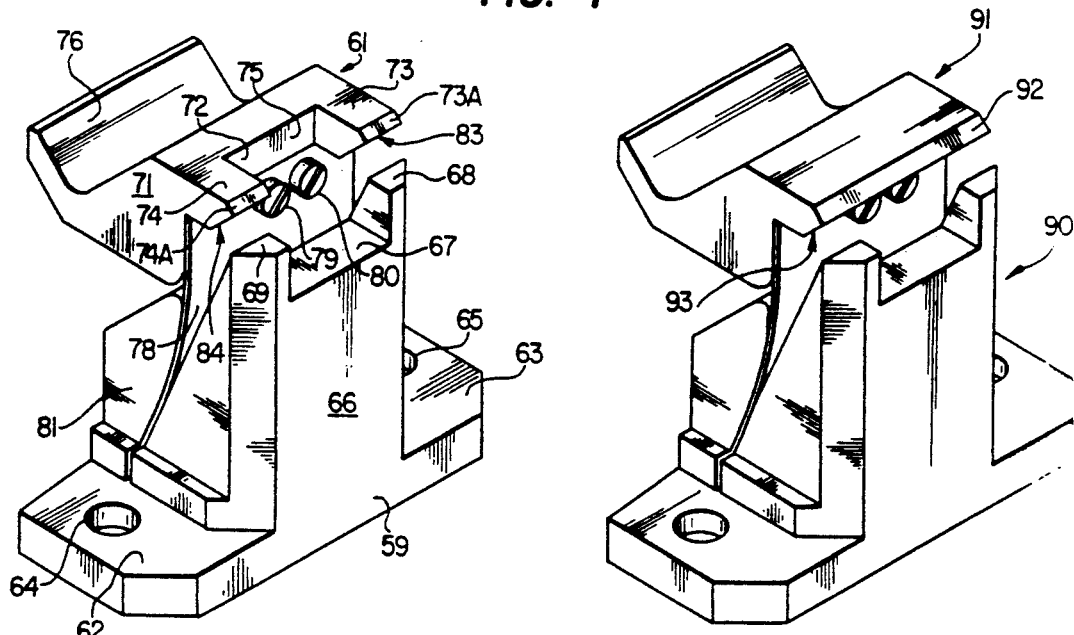
FIG. 4
FIG. 6 (PRIOR ART)

METHOD OF SECURING SEMI-CONDUCTOR WAFER USING RETENTION CLIP

This is a division, of application Ser. No. 07/617,008, filed Nov. 21, 1990 now U.S. Pat. No. 5,183,245.

BACKGROUND OF THE INVENTION

1. Field of the Invention

The present invention relates to semi-conductor wafer handling equipment and, more particularly, to an improved clip and method for securing a semi-conductor wafer to the surface of a support pedestal.

2. History of the Prior Art

In the manufacture of semi-conductor devices, such as integrated circuits, a plurality of devices are generally formed on a single circular wafer of silicon material. The wafer is typically circular in shape and on the order of 6 inches in diameter. The wafers are put through a number of sequential processing steps, including coating them with photo-resists, exposing them to the optical patterns formed on photo masks, and exposing them to both liquid and gaseous treating environments.

The processing of a silicon wafer containing a plurality of semi-conductor devices requires a high degree of cleanliness and sterility in the environment in order to produce acceptable devices. The ability of a semi-conductor device to perform satisfactorily from both an electrical and mechanical standpoint depends upon the nature and quality of the materials forming the various layers of the device. The chemical composition of these materials must be extremely pure. The introduction of any foreign matter into the environment where the wafers are being processed results in a decrease in the "yield" of the wafer. The yield is the number of devices that can pass the required electrical tests of the device after the processing has been completed. This is usually expressed as a fraction of the total number of devices processed on the wafer that did pass the required tests. Thus, the higher the purity of the processing environment and processing techniques used in manufacturing the semi-conductor devices, the greater the yield and hence the greater the financial return to the manufacturer.

Semi-conductor wafers are conventionally exposed to liquid and gaseous treating environments by positioning them within a sealed chamber conventionally referred to as an "etcher." All outside contaminants are excluded from the environment within the etcher which is used to simultaneously expose a plurality of wafers being processed to various gases and/or liquids during the wafer processing operation. One type of semi-conductor wafer processing etcher includes, within the sealed chamber, a hexagonal column referred to as a "hexode". The hexode has a plurality of vertically extending planar sidewalls, and attached to each sidewall are a plurality of support "pedestals." A semi-conductor wafer being processed is attached to such a pedestal and held there by means of wafer retaining clips mounted therearound.

The interior of a typical hexode contains cooling coils for removing heat from the back side of the highly conductive support pedestals and, hence, from the semi-conductor wafers which they support. The back side of each wafer is held flush against the flat upper surface of a pedestal to provide a good heat transfer engagement therebetween in order to cool the wafer and keep the temperature gradients across its surface uniform during processing. It is important that the many different semi-conductor devices being simultaneously formed on the front surface of the wafer each be exposed to the same temperatures and chemicals for identical periods of time in order to ensure uniformity of electrical operating characteristics in each device.

At the end of a processing cycle, the sealed chamber of the etcher is opened and a robotic manipulator is used to depress the latches on the wafer retaining clips and grip the silicon wafers by their edges to remove them from the mounting surface of the pedestals and transfer them to their next processing operation.

To guard against the introduction of impurities into the silicon wafer processing environment, the equipment operators preferably wear caps, gowns, and surgically sterile rubber gloves when they are handling any of the equipment associated with the wafers. In addition, the operators also frequently change gloves, sometimes three to four times per day, to reduce the amount of contaminants which might accumulate thereon and affect the wafer processing environment. Despite all of these precautions, it has been found that the interior of the etchers must be cleaned periodically to remove as many potential future contaminants of the wafers as possible. In addition, the equipment within the interior of the etchers is periodically replaced completely because of an accumulation of potential contaminants which invariably come in contact with the wafers and reduce their yield. Because of the expense connected with both cleaning an etcher as well as periodically replacing the interior parts of an etcher, it is highly desirable to attempt to maximize the length of time in which an etcher can operate without either a cleaning or a replacement of its interior parts. For this reason, it is desirable to provide equipment with which the wafers come in contact of the type minimizing the tendency toward wafer contaminant pollution.

It has been found that one of the means by which contaminants are transferred to the wafers is the wafer retaining clips which are disposed around the periphery of the wafer pedestals mounted on the hexode. Even though these clips are relatively clean and simple in design, it has been found that prior art clip designs tend to accumulate contaminating materials. Such contaminants are accumulated during the processing cycle of one particular batch of wafers and then passed on to a second batch of wafers when they are introduced into the etcher. It has also been found that the specific geometric configuration of the pedestal clips has a relationship to the number of contaminants it collects and in the way in which those contaminants may be passed on to other batches of semi-conductor wafers.

It would, thus, be desirable to provide an improved pedestal retention clip for securing semi-conductor wafers to pedestal surfaces which minimizes the contamination of wafers. The clips should also be quickly and easily detachable from the edge of the semi-conductor wafer and should be easily actuatable by a robotic tool.

SUMMARY OF THE INVENTION

The present invention pertains to a pedestal clip for securing a semi-conductor wafer to a processing pedestal. In one aspect, the invention includes a pedestal clip constructed to minimize the contact between the clip and the edge of the wafer and to minimize the tendency of the clip to contaminate the wafer with foreign particles. The clip includes a base member adapted for securement to the pedestal and an upstanding body portion extending from the base member toward the treatment surface of the pedestal to which the wafer is to be secured. A clip head is mounted to the body portion for resilient movement with respect thereto. The clip head includes a pair of spaced apart, forwardly extending tines adapted to engage outer edges of a semi-conductor wafer supported upon the treatment surface of the processing pedestal. A clip tail is oppositely disposed from the tines, the tail affording resilient movement of the tines toward and away from the edges of the pedestal treatment surface to enable the installation and removal of the wafer therefrom.

In another aspect of the invention, the tines of the clip described above are separated from one another by a space equal to at least twice the width of one of the tines. The lower surfaces of each of the edges also forms an angle with respect to the treatment surface of the pedestal on the order of 45 degrees. The resilient means for securing the head portion to the body portion also comprises a flexible metal strip.

In yet another aspect, the invention includes an improved method for securing a semi-conductor wafer to the surface of a wafer processing pedestal of the type wherein a clip head is flexibly mounted relative to the pedestal for facilitating the installation and removal of the wafer therefrom. The improvement comprising the steps of forming the clip head with first and second tines spaced one from the other and adapted to engage outer edges of the wafer. An angulated surface is formed beneath each tine and the clip head is positioned to present the angulated surface toward the pedestal. A rear portion of the clip head is then depressed to flex the resilient securing means and allow movement of the head with respect to the pedestal for the securement and removal of the wafer relative thereto.

BRIEF DESCRIPTION OF THE DRAWINGS

For an understanding of the present invention and for further objects and advantages thereof, reference may now be had to the following description taken in conjunction with accompanying drawings, in which:

FIG. 1 is a partially cut-away perspective view of a semi-conductor wafer etcher with the cover having been removed therefrom;

FIG. 4 is a perspective view of a pedestal clip constructed in accordance with the teachings of the present invention;

FIG. 6 is a perspective view of a prior art pedestal clip;

DESCRIPTION OF THE PREFERRED EMBODIMENT

Figure 2B:
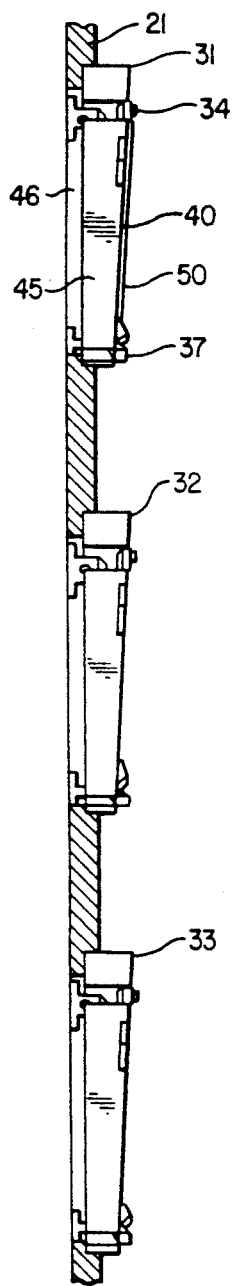
FIG. 2B is a cross-section view of the hexode wall and pedestals mounted thereon taken about the lines 2B—2B of FIG. 2A.

Referring to FIG. 1, there is shown a partially cut-away perspective view of a silicon wafer etcher 10 which includes a circular bottom 11 through which is formed a plurality of openings 12 and 13 for the ingress and egress of fluids along with distribution piping 14 extending up into the etcher for similar purposes. The etcher includes generally cylindrical sidewalls 15 within which is formed a transparent inspection port 16 so that an operator can view the interior. The sidewalls 15 include an upper sealing edge 17 to which is sealingly fitted a cover (not shown) for enclosing the interior of the etcher.

Mounted to the bottom 11 of the etcher 10 and extending in an axial direction therein is a hexode 18 having 6 vertically extending planar sides 21–26. Upon each of the sides 21–26 is mounted a plurality of semi-conductor wafer supporting pedestals 31, 32, and 33. Pedestals are only illustrated on sides 21, 25 and 26 in FIG. 1 for purposes of clarity, but it should be understood that each of the other sides 22, 23 and 24 also include three pedestals 31–33 mounted thereon. A semi-conductor wafer can be removably mounted onto each of the pedestals 31–33 for processing within the sealed environment of the etcher 10. For this purpose, each pedestal includes a plurality of clips 34–37 for removably securing a wafer to the flat, circular mounting surface of the pedestal.

Figure 2A:
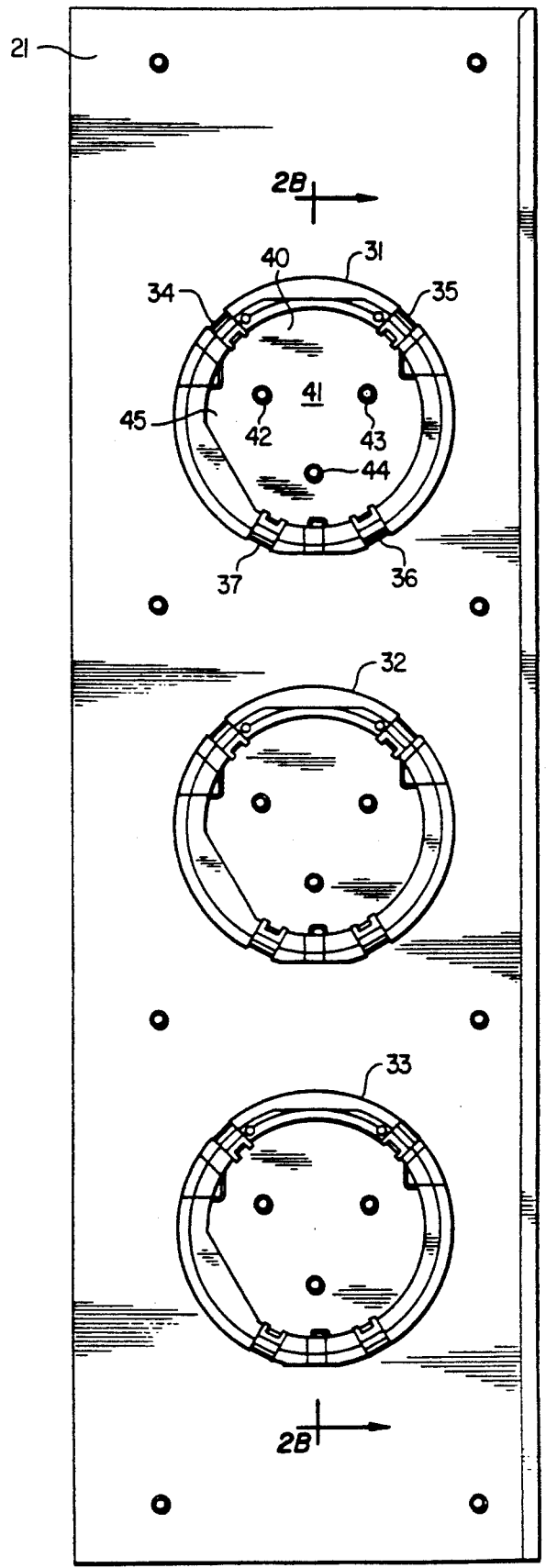
FIG. 2A is a plan view of one planar sidewall of the hexode located within the etcher of FIG. 1 showing the pedestals mounted thereon.

Referring next to FIG. 2A, there is shown a plan view of a sidewall 21 of the hexode 18 and the pedestals 31–33 mounted thereon. Each pedestal is generally circular in shape and includes wafer retaining clips 34–37 mounted thereto for removably securing a semi-conductor wafer to the flat mounting surface 40 of the pedestal. The pedestal 31 is itself made from a highly thermally conductive metal such as an aluminum alloy. The mounting surface 40 of the pedestal 31 is covered with a smooth thermally conductive elastomeric material 41 for receiving the rear surface of the semi-conductor wafer thereagainst. A plurality of holes 42–44 are formed through both the elastomeric material 41 as well as through the solid body 45 of the pedestal 31 for purposes of mounting.

Referring next to FIG. 2B there is shown a cross-section view through side 21 of the hexode 18 and the pedestals 31–33 taken about the line 2B—2B of FIG. 2A. As can be seen in the cross-section view of FIG. 2B, the solid body 45 of each pedestal 31–33 comprises a relatively solid single piece of highly conductive metal which conducts heat from the front, or mounting surface 40, side of the pedestal to the interior of the hexode 18 with which the rear side 46 of the pedestal 31 is in contact. The solid body 45 increases the rate of thermal conductivity through the pedestals 31–33 and provides a uniform distribution of temperature over the entire mounting surface 40 of the pedestals. Only one silicon wafer 50 is shown on the metal pedestal 31 for illustration. The other pedestals 32 and 33 are shown unoccupied for purposes of clarity.

Figure 3:
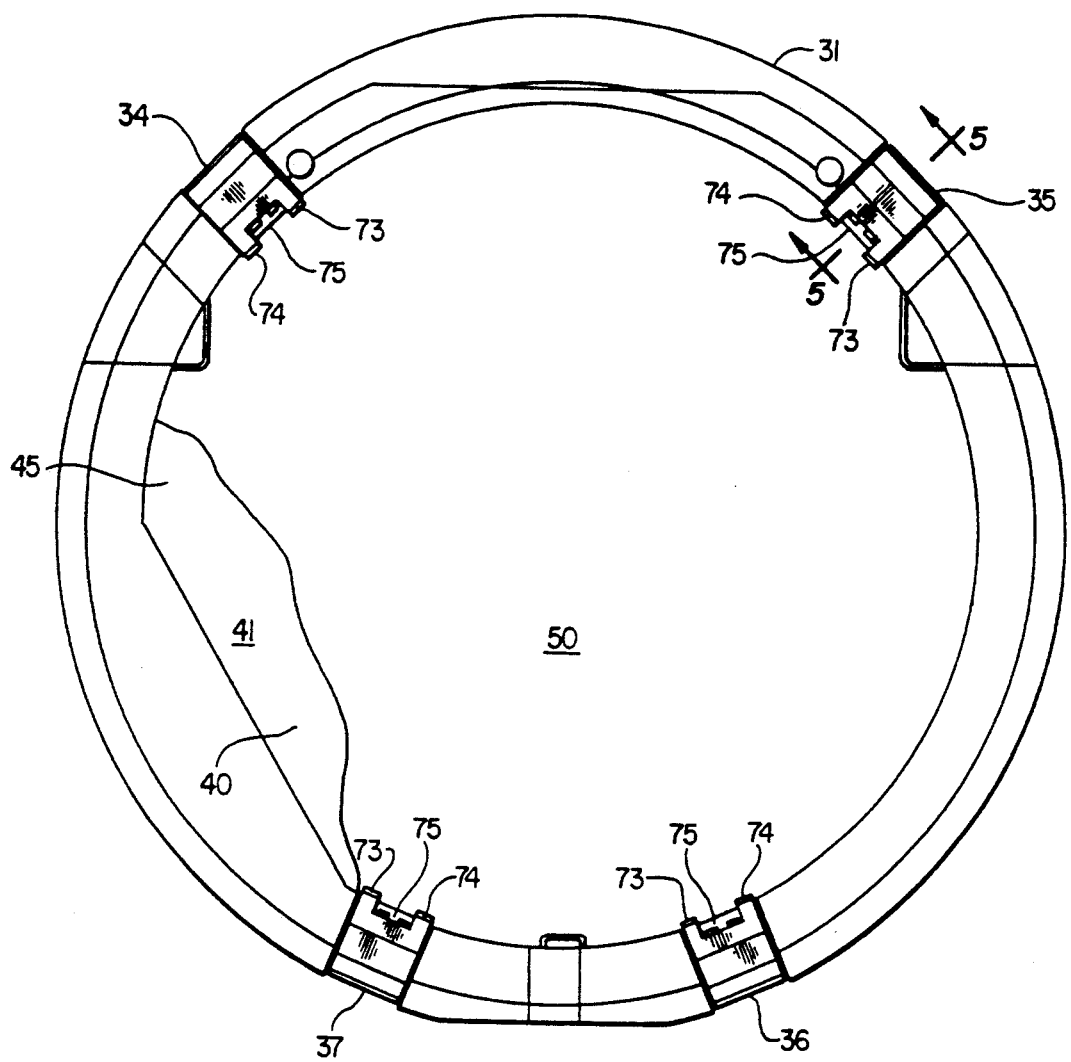
FIG. 3 is a top-plan view of a single pedestal having four pedestal clips constructed in accordance with the teachings of the present invention disposed around the periphery thereof.

Referring next to FIG. 3, there is shown a top plan view of a pedestal 31 including a plurality of pedestal clips 34–37 mounted thereon. As shown, each pedestal is circular and includes a solid body 45 of highly conductive material with a flat mounting surface 40. The mounting surface 40 is covered with a layer of elastomeric material 41, which is also highly conductive, facilitating the close, thermally mounting of the wafer thereon. A semi-conductor wafer 50 is shown positioned flush against the elastomeric covering 41 of the mounting surface 40 of the pedestal 31. As can be seen, each of the clips 34-37 of this figure includes a pair of tines 73 and 74 which overlay and secure the outer edges of the semi-conductor wafer 50 to the surface of the pedestal.

Referring next to FIG. 4, there is shown a perspective view of a pedestal clip 61 constructed in accordance with the teachings of the present invention. Each clip 61 is formed of Lexan and adapted for securement to a pedestal and includes a base 59 constructed with a pair of outwardly extending mounting flanges 62 and 63 on opposite sides thereof. The flanges 62 and 63 each include a mounting hole 64 and 65, respectively, for securing the pedestal clip to the underside of the pedestal. Extending upwardly from the base 59 is a front mounting column 66 which includes a bifurcated upper end formed by upstanding posts 68 and 69 separated by recess 67. A securement head 71 has a bifurcated front securement dog 72 including first and second securement tines 73 and 74 separated by an open area 75 therebetween. Tines 73 and 74 are constructed with a relatively narrow frontwardly extending linear edges 73A and 74A, respectively. The rear portion of the securement head 71 includes a depression tab 76 which is adapted for downward engagement by a tool. Depression of tab 76 releases the clip 61 from securement of a wafer positioned on a pedestal. The securement head 71 is mounted to the pedestal column 66 by means of a flexible metal spring 78 to which the securement head 71 is attached by means of a pair of screws 79 and 80. The lower rear surface of the metal spring 78 is engaged by a mounting member 81 which grips the lower edge of said spring between the member 81 and the front surface of the mounting column 66. The head 71 is thus flexibly secured to the mounting column 66 in a position for engaging a wafer, and for moving both toward and away from said wafer. The mounting member 81 is secured to the mounting column 66 of the clip 61 by means of a screw 82 shown in the cross-section view of FIG. 5.

It should be clear from observation of the prior art pedestal clip 90 of FIG. 6 that it is similar to the pedestal clip 61 of the present invention. There are, however, certain significant differences between these clips. For example, the securement head 91 of the prior art clip 90 includes a continuous, linear surface across its entire frontal wafer engaging position. The surface comprises a singular, frontwardly extending linear edge 92. The clip 61 of the present invention, in contrast, includes two separate edges 83 and 84 separated by an open area 75 which is approximately as wide as twice the width of each of the edges 83 and 84. In addition, the underlying wafer engagement surface 93 extending beneath the edge 92 of the prior art clip of FIG. 6 is deeper, thereby presenting more surface area toward the wafer edge for engagement therewith. In the present embodiment the angle to the horizontal surface of the wafer to be secured (not shown in FIG. 6) is on the order of 45 degrees, and because of the length of the wafer engagement surface 93, the upper beveled edge 92 of the prior art clip is wider than the edges 73 and 74 of the clip 61 of the present invention.

From product testing, it has been shown that the pedestal retaining clip of the present invention has produced a substantial reduction in the level of contaminants found on wafers processed on pedestals fitted with that clip. While there is still no exact understanding of all of the reasons why this has occurred, some of the reasons include the fact that only two relatively short lengths of edge surfaces 83 and 84 of the pedestal clip 61 actually engage the upper edges of the silicon wafer secured thereunder. The open area 75 between the surfaces 83 and 84 presents a substantially smaller surface area upon which contaminants may collect and subsequently be passed to other wafers. In addition, the edges 83 and 84 of the pedestal clip 61 present a longer, inclined surface area to the upper surface of the silicon wafer 50 (as shown in FIG. 5) which facilitates engagement of said wafer.

Figure 7:
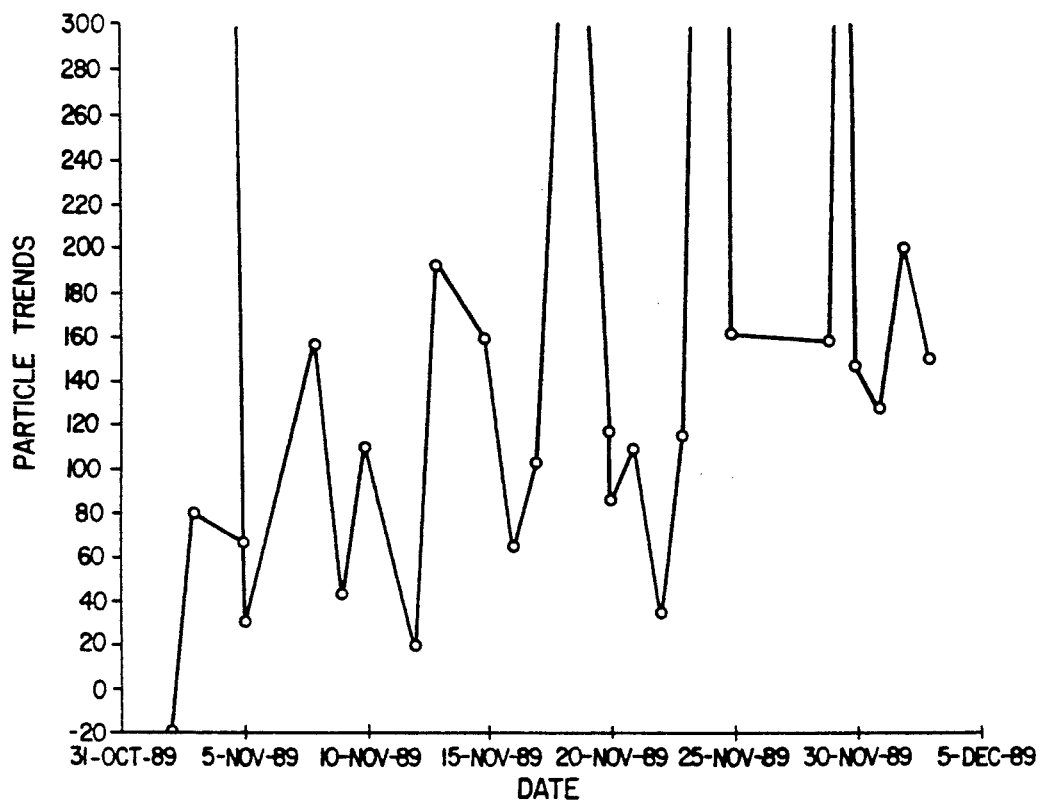
FIG. 7 is a contamination graph representing wafer contamination utilizing prior art pedestal clips.
Figure 8:
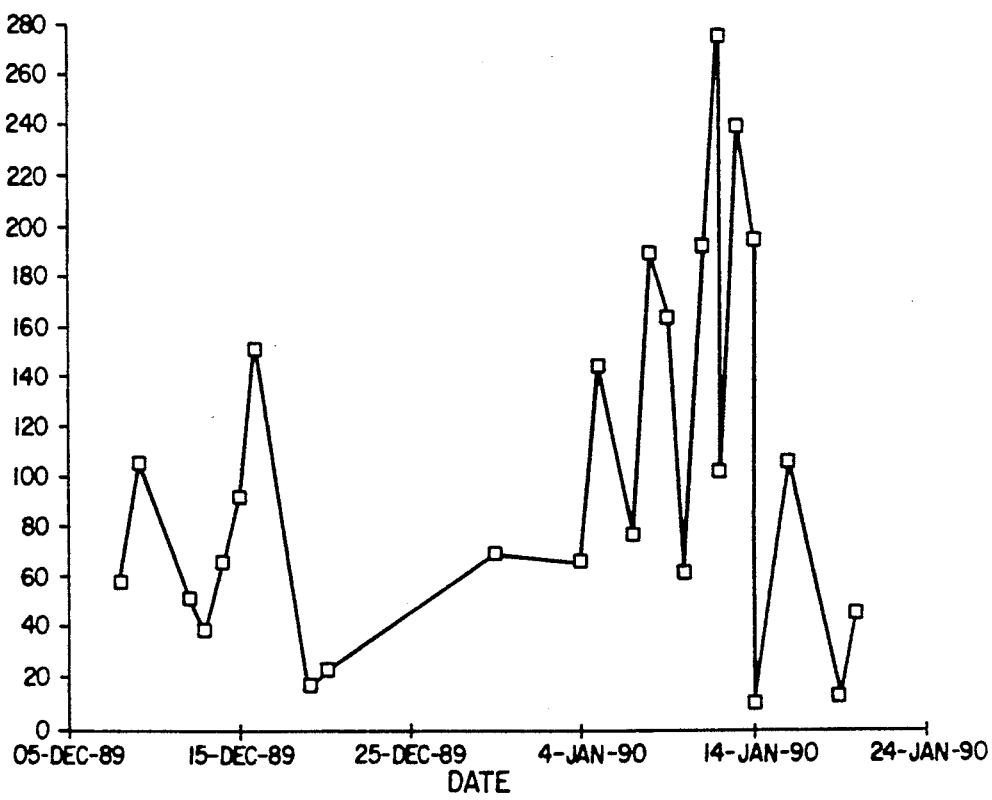
FIG. 8 is a contamination graph representing wafer contamination utilizing the pedestal clips of the present invention.

Referring now to FIGS. 7 and 8, there is shown a series of contamination graphs which represent the number of particles and impurities found in wafers manufactured by particular etchers over a select period of time. In FIG. 7 it is shown that over a period of usage of approximately two months, the particle trends (contamination) on silicon wafers processed in a particular etcher with the prior art clip of FIG. 6 varied significantly. On certain occasions, the contamination was in excess of 300 particles.

FIG. 8 is a contamination graph for the same etcher as shown in FIG. 7 over a comparable period of time after the clips 61 of the present invention had been substituted for the prior art clips 90. The graph illustrates the substantially decreased rate of contaminants over a substantially longer period of time of 510 runs compared to 350 runs with the prior art clip. It should also be noted that even after substantial usage, none of the particle counts of contaminants was in excess of 300 with the clip 61 of the present invention.

Figure 5:
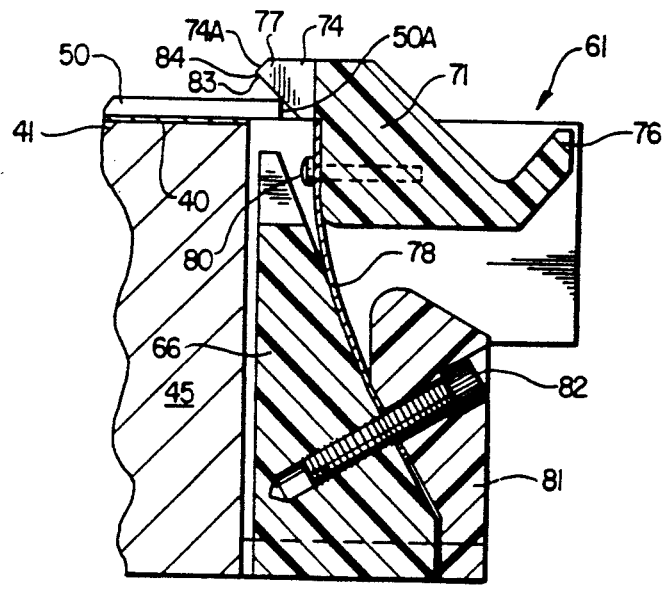
FIG. 5 is a vertical cross-section view of the pedestal clip shown in FIG. 4.

Referring now to FIGS. 3 and 5 in combination, the pedestal clip 61 of the present invention functions to secure a semi-conductor wafer 50 to the upper surface of a pedestal 31 by the spring biased, resilient engagement of its bifurcated, transversely extending edges 83 and 84 against the outer peripheral edges 50A of a semi-conductor wafer 50. In order to install the wafer onto the surface of the pedestal, a robotic actuator (not shown) is used to engage and simultaneously depress the tab portion 76 of each of the four pedestal clips 34, 35, 36 and 37 shown in FIG. 3. Depressing tabs 76 provides clearance and allows the robotic manipulator to place the semi-conductor wafer 50 directly against the mounting surface 40 of the pedestal. Once the wafer 50 is in position on the pedestal 31, the robotic manipulator releases the engaged tab portions 76 of the clips 34-37 to permit their forwardly extending edges 83 and 84 to engage the outer peripheral edge 50A of the wafer 50. Thereafter the clips hold the wafer 50 in position upon the pedestal 31 while the wafers 50 are being processed within the etcher. Upon completion of the processing cycles, the robotic manipulator again depresses the tab portions 76 of the clips 34-37 and allows the manipulator to remove the wafer from the surface of the pedestal for transportation to a subsequent processing operation.

As shown in FIGS. 3 and 5, the forwardly extending edges 83 and 84 of the pedestal clip of the present invention engage the outer peripheral edge of the wafer 50 in a restricted area of contact so as to limit the exposure of the surface of the wafer to contamination by particles collected upon the clip. Moreover, the open area 75 between the edges 83 and 84 provides a reduced surface area of contact between the clip and the wafer and thus reduces the amount of exposure of the wafer clip to surface areas which may carry contaminants. The improved pedestal clip of the present invention thus provides a functional and useful clip for efficiently and reliably securing semi-conductor wafers to the upper surface of a pedestal for processing. It has been shown that the use of the pedestal clip of the present invention on pedestals substantially increases the yield of the semi-conductor wafers secured to the pedestal and thus provides a number of distinct advantages over prior art pedestal clips.

It is thus believed that the operation and construction of the present invention will be apparent by the foregoing description. While the method and apparatus shown or described has been characterized as being preferred, it will be obvious that various changes and modifications may be made therein without departing from the spirit and scope of the invention as defined in the following claims.

What is claimed is:

1. An improved method for securing a semi-conductor wafer to a treatment surface of a wafer processing pedestal using a clip head that is resiliently mounted relative to said pedestal for facilitating the installation and removal of said wafer therefrom, said improvement comprising the steps of:

forming said clip head with a relatively wide, rearwardly extending notch defining a pair of spaced apart, relatively narrow, forwardly extending tines having underside surfaces adapted to slopingly overlie and engage only relatively small, spaced apart peripheral edge portions of said wafer, and, configuring said clip head to substantially reduce the amount of wafer contamination attributable to said clip;

depressing a rear portion of said clip head to flex said resilient mounting to allow movement of said tines of said clip head away from said treatment surface of said pedestal;

positioning said wafer on said treatment surface with said peripheral edge portions of said wafer aligned under said underside surfaces of said tines; and releasing said rear portion of said clip head to allow said resilient mounting to move said clip head until said underside surfaces of said tines engage said peripheral edge portions of said wafer thereby securing said wafer against said treatment surface of said pedestal and whereby the presence of said notch, the relative narrowness of said tines, and the resultant limited contact between said clip head and the supported wafer combining to reduce both the available contaminant receiving surface area of said clip head and the amount of contaminant matter transferred from said clip head to the supported wafer.

2. The method as set forth in claim 1 wherein said step of forming said clip head includes forming said tines in generally parallel spaced relationship one with the other.

3. The method as set forth in claim 2 wherein said step of forming said tines in generally parallel spaced relationship includes the step of spacing said tines one from the other a distance equal to at least twice the width of one of said tines.

4. The method as set forth in claim 1 wherein said step of forming said clip head includes the step of forming said underside surfaces of said tines with an angulated clamping surface adapted for engaging said peripheral edge of said wafer.

5. The method as set forth in claim 4 wherein said step of forming said tines with an angulated clamping surface includes the step of forming said clamping surface at an angle on the order of 45° with respect to the treatment surface of said pedestal.

* * * * *